United States Patent
Che et al.

(10) Patent No.: US 11,251,386 B2
(45) Date of Patent: Feb. 15, 2022

(54) HIGHLY EFFICIENT SMALL MOLECULE MULTI-JUNCTION ORGANIC PHOTOVOLTAIC CELLS

(71) Applicant: THE REGENTS OF THE UNIVERSITY OF MICHIGAN, Ann Arbor, MI (US)

(72) Inventors: Xiaozhou Che, Ann Arbor, MI (US); Xin Xiao, Ann Arbor, MI (US); Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/125,690

(22) PCT Filed: Apr. 6, 2015

(86) PCT No.: PCT/US2015/024565
§ 371 (c)(1),
(2) Date: Sep. 13, 2016

(87) PCT Pub. No.: WO2015/154088
PCT Pub. Date: Oct. 8, 2015

(65) Prior Publication Data
US 2017/0005284 A1   Jan. 5, 2017

Related U.S. Application Data

(60) Provisional application No. 61/975,630, filed on Apr. 4, 2014, provisional application No. 61/975,626, filed (Continued)

(51) Int. Cl.
*H01L 51/42* (2006.01)
*H01L 51/00* (2006.01)

(52) U.S. Cl.
CPC ........ *H01L 51/4246* (2013.01); *H01L 51/422* (2013.01); *H01L 51/0046* (2013.01); (Continued)

(58) Field of Classification Search
CPC .............. H01L 51/4246; H01L 51/422; H01L 51/0046; H01L 51/0054; H01L 51/0056; (Continued)

(56) References Cited

PUBLICATIONS

Cheyns et al., Accurate spectral response measurements of a complementary absorbing organic tandem cell with fill factor exceeding the subcells, Applied Physics Letters, vol./Issue 104, pp. 093302-1 through 093302-4. Published Mar. 3, 2014. (Year: 2014).*

(Continued)

*Primary Examiner* — Jayne L Mershon
(74) *Attorney, Agent, or Firm* — Finnegan, Henderson, Farabow, Garrett & Dunner LLP

(57) ABSTRACT

A highly efficient multi junction photovoltaic device, such as a two, three, or four junction device, is disclosed. The multi-junction device may include a first subcell comprising a first photoactive region and a second subcell comprising a second photoactive region. The first and second photoactive regions are designed to minimize spectral overlap and maximize photocurrent across a broad absorption spectra, such as wavelengths ranging from 400 nm to 900 nm. The device may further include an inter-connecting layer, disposed between the first subcell and the second subcell, that is at least substantially transparent. By introducing a transparent interconnecting layer, a dual element (tandem) cell achieves a power conversion efficiency of 10.0±0.5%. By adding an additional ($3^{rd}$) sub-cell that absorbs at the second order optical interference maximum within the stack. The triple junction cell significantly improves the quantum efficiency at shorter wavelengths, achieving a power conversion efficiency of 11.1±0.5%. Adding additional sub-cells has (Continued)

been shown to increase power conversion efficiency above 12%.

20 Claims, 4 Drawing Sheets

Related U.S. Application Data on Apr. 4, 2014, provisional application No. 61/976,942, filed on Apr. 8, 2014.

(52) U.S. Cl.
CPC ...... *H01L 51/0054* (2013.01); *H01L 51/0056* (2013.01); *H01L 51/0059* (2013.01); *H01L 51/0068* (2013.01); *H01L 51/0069* (2013.01); *H01L 51/0072* (2013.01); *Y02E 10/549* (2013.01); *Y02P 70/50* (2015.11)

(58) Field of Classification Search
CPC ............. H01L 51/0059; H01L 51/0068; H01L 51/0069; H01L 51/0072
USPC ........................................................ 136/263
See application file for complete search history.

(56) References Cited

PUBLICATIONS

Chiu et al., A donor-acceptor-acceptor molecule for vacuum-processed organic solar cells with a power conversion efficiency of 6.4%, Chem. Communication, vol./Issue 48, pp. 1857-1859 (Year: 2012).*

Zheng et al., Highly efficient bulk heterojunction photovoltaic cells based on C70 and tetraphenyldibenzoperiflanthene. Applied Physics Letters, vol./Issue 102, pp. 143304-1 through 143304-4 (Year: 2013).*

Li et al., Role of transition metal oxides in the charge recombination layer used in tandem organic photovoltaic cells, Journal Material Chemistry, vol./Issue 22, pp. 6285-6290 (Year: 2012).*

Li et al., Efficient Tandem and triple-junction Polymer Solar Cells, Journal of the American Chemical Society, vol./Issue 135, pp. 5529-5532 (Year: 2013).*

Bergemann et al., Surprisingly High Conductivity and Efficient Exciton Blocking in Fullerene/Wide-Energy-Gap Small Molecule Mixtures, American Chemical Society, Nano Letters, pp. 3994-3999 (Year: 2015).*

Cheyns, et al., "Accurate spectral response measurements of a complementary absorbing organic tandem cell with fill factor exceeding the subcells," *Applied Physics Letters, American Institute of Physics*, vol. 4, No. 9, pp. 093302-2, 093302-3, Mar. 3, 2014.

Zheng, et al., "Highly efficient bulk heterojunction photovoltaic cells based on C and tetraphenyldibenzoperiflanthene," *Applied Physics*, vol. 102, No. 14, pp. 143304-143304, Apr. 8, 2013.

Jian et al., "Role of transition metal oxides in the charge recombination layer used in tandem organic photovoltaic cells," *Journal of Materials Chemistry*, vol. 22, No. 123, p. 6285, Jan. 1, 2012.

Weiwei et al., "Efficient Tandem and Triple-Junction Polymer Solar Cells," *Journal of the American Chemical Society*, vol. 135, No. 15, pp. 5529-5532, Apr. 17, 2013.

International Search Report & Written Opinion, PCT/US2015/024565, dated Aug. 21, 2015.

* cited by examiner

HIGHLY EFFICIENT SMALL MOLECULE MULTI-JUNCTION ORGANIC PHOTOVOLTAIC CELLS

CROSS-REFERENCE TO RELATED APPLICATION

This application claims the benefit of U.S. Provisional Application No. 61/975,626, filed Apr. 4, 2014, U.S. Provisional Application No. 61/975,630, filed Apr. 4, 2014, U.S. Provisional Application No.: 61/976,942, filed: Apr. 8, 2014, all of which are incorporated herein by reference in their entirety.

STATEMENT REGARDING FEDERALLY SPONSORED RESEARCH

This invention was made with U.S. Government support under Contract Nos. DE-EE0005310 and DE-SC0000957 awarded by the U.S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to electrically active, optically active, solar, and semiconductor devices and, in particular, to high efficiency small molecule multi-junction photovoltaic devices.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with the specific applications requirements. Traditionally, photosensitive optoelectronic devices have been constructed of a number of inorganic semiconductors, e.g., crystalline, polycrystalline and amorphous silicon, gallium arsenide, cadmium telluride, and others.

More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or subcells.

Single-junction small molecule OPVs have achieved a power conversion efficiency of greater than 8%, but the narrow absorption range, low $V_{OC}$, and large thermalization energy losses at short wavelengths ultimately limit the power conversion efficiencies of single element OPVs. This shortcoming has led to the investigation tandem cell OPVs whose design can allow for more complete coverage of the solar spectrum while maintaining a high $V_{OC}$.

In particular, tandem solar cells have been studied as a means to increase the spectral coverage and efficiency of OPVs. Most of these tandem cell OPVs have been made with polymer materials or solutions based fabrication processes. Polymer tandem photovoltaic cells have already demonstrated a power conversion efficiency of $\eta_P=10.6\%$. Similar high efficiency small molecule cells have not yet been demonstrated.

In previously developed small molecule tandem cells, current is limited by the front near infrared (NIR)-absorbing subcell that also absorbs shorter wavelength photons, preventing those photons from reaching the back subcell. These tandem cells may still deliver high efficiency, however, since the sub cells are sufficiently thin, owing to the short exciton diffusion length ($L_D \sim 10$ nm) characteristic of a small molecule active region, to remain semi-transparent. To mitigate the problem of short diffusion length, vacuum deposited planar-mixed heterojunction (PM-HJ) active regions have been used in which the donor and the acceptor molecules are mixed in the active region. The PM-HJ is not limited by $L_D$ but rather the much larger charge collection length. Thus the photoactive region is thickened to enhance optical absorption without compromising cell efficiency. To further reduce biomolecular recombination at mixed layer interfaces while increasing absorption, a PM-HJ may also employ a neat donor and/or acceptor layer with a thickness comparable to $L_D$ adjacent to the mixed region.

Unfortunately, such thick and highly absorbing subcells typically result in spectral overlaps between elements in the tandem, ultimately limiting photocurrent. Additionally, tandem cells generally include one or more layers separating the constituent subcells. Such layers may require certain qualities, such as sufficient conductivity, transparency, surface roughness, and mechanical and chemical stability. In particular, these layers must be deposited in a manner as not to affect the already deposited subcell and must be sufficiently stable to withstand the deposition of the yet to be deposited layers. Previously used separating layers have also suffered from low charge recombination efficiency, which ideally should be near unity, and high absorption characteristics, which reduce the amount of electromagnetic radiation that reaches the back subcell. For instance, conventional use of PTCBI results in significant absorption loss in the visible spectrum.

In view of the foregoing, there is disclosed a new donor molecule that has Donor-Acceptor-Acceptor structure to facilitate strong intramolecular electron transfer leading to large molecular dipole moment thus promoting efficient electron orbital overlap between these molecules in the solid beneficial for charge transport.

There is also disclosed tandem or multi-junction OPVs, that contain this new donor molecule, such that the front (near the anode), near-infrared (NIR)-sensitive sub-cell absorbs a large fraction of higher energy photons prior to their arrival at the back (adjacent to the cathode) green-absorbing sub-cell, thereby limiting the short circuit current ($J_{SC}$). Because of these properties, multi-junction OPVs employing nanocrystalline planar-mixed heterojunctions (PM-HJ) with the new donor molecule for the sub-cells in the stacks, the PM-HJ has a large charge collection length. As a result the photoactive region can be made thick compared with conventional planar junctions, thereby increasing light absorption.

To achieve the objects and in accordance with the purpose of the invention, as embodied and broadly described herein, the invention includes a multi-junction photovoltaic device, such as a tandem, triple, four junction, or more device, comprising: a first subcell comprising a first photoactive region; and a second subcell comprising a second photoactive region. The first photoactive region comprises a first donor material comprising a donor-acceptor-acceptor molecule having an NIR absorption spectra, and a first acceptor material comprising a fullerene, wherein the first donor material and the first acceptor material forms a first donor-acceptor heterojunction.

The device further comprises a second photoactive region comprising a second donor material having an absorption spectra that is complementary with the absorption spectra of the first donor material, and a second acceptor material comprising a fullerene, wherein the second donor material and the second acceptor material forms a second donor-acceptor heterojunction. The first and second photoactive regions are designed to minimize spectral overlap and maximize photocurrent across a broad absorption spectra, such as wavelengths ranging from 400 nm to 900 nm.

In an embodiment, there is disclosed novel high efficiency small molecule tandem photovoltaic devices in which the front sub-cell comprises an NIR-absorbing donor, such as 2-((7-(5-(dip-tolylamino)thiophen-2-yl)benzo[c][1,2,5] thiadiazol-4-yl) methylene)malononitrile (DTDCTB) and derivatives thereof.

In various embodiments, the DTDCTB donor is mixed with a fullerene, such as $C_{60}$ or $C_{70}$. In an embodiment, this donor is paired with a green-absorbing donor in the second cell, such as dibenzo([f,f']-4,4',7,7-tetraphenyl)diindeno[1,2,3-cd:1',2',3'-lm] perylene (DBP):$C_{70}$, or (2-[(7-{4-[N,N-Bis(4-methylphenyl)amino]phenyl}-2,1,3-benzothiadiazol-4-yl)methylene]propanedinitrile (DTDCPB):$C_{70}$, for the back sub-cell.

Like (DBP):$C_{70}$, the DTDCPB:$C_{70}$ mainly absorbs in green (300-800 nm) rather than NIR as does the DTDCTB: fullerene donor. It is noted that DTDCPB:$C_{70}$ has about a 100 nm longer absorption range the DBP:$C_{70}$, and thus allows for varying with absorption spectra when used as the back cell in a multi-junction device in addition to, or instead of DBP:$C_{70}$.

In one embodiment that is a tandem cell, when the front cell comprises an NIR absorbing DTDCTB based donor, and the back cell comprises a green absorbing back cell, as described, the combination provides a spectrally complementary system that achieves a power conversion efficiency of $\eta P=10.0\pm0.5\%$. There is also disclosed a triple junction OPV by adding a second DBP:C70 or (DTDCPB):$C_{70}$ sub-cell as the front cell, fitting into the second order optical interference maximum in the device active region. This triple junction OPV can achieve a power conversion efficiency of $\eta P$ greater than 11.0%, and a four junction OPV can achieve a power conversion efficiency of $\eta P$ greater than 12.0%.

To achieve a further object of the invention, the multi-junction photovoltaic device may include a separating layer disposed between the various subcells. In some embodiments, the separating layer comprises an interconnecting layer comprising a mixture of a wide energy gap material and either an electron conducting material or a hole conducting material.

It is to be understood that both the foregoing general description and the following detailed description are exemplary and explanatory only and are not restrictive of the invention, as claimed.

BRIEF DESCRIPTION OF THE DRAWINGS

The accompanying figures, which are incorporated in and constitute a part of this specification, illustrate several embodiments of the invention and together with the description, serve to explain the principles of the invention.

Figure 1A:
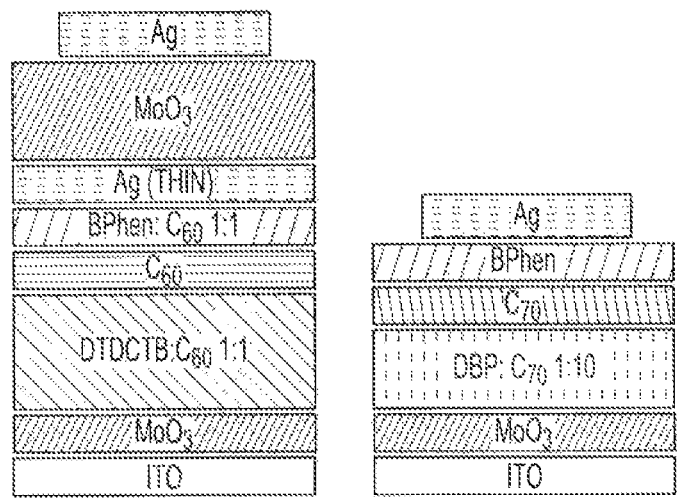
FIG. 1 (a) Front (left) and back (right) sub-cell structures based on the optimized tandem cell. (b) Absorption coefficients of the absorbing layers DTDCTB:$C_{60}$ and DBP:$C_{70}$ (dashed lines) and the external quantum efficiency (EQE) of the sub-cells (solid lines).

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device.

In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the incident electromagnetic radiation in relevant wavelengths to be transmitted through it. An electrode is said to be "semi-transparent" when it permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

In the context of the organic materials of the present disclosure, the terms "donor" and "acceptor" refer to the relative positions of the HOMO and LUMO energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

There is described a fully vacuum-deposited small molecule multi-junction OPV cells comprising two or three PM-HJ sub-cells. The front and back sub-cells in the tandem structure are spectrally complementary, with minimal absorption overlap. The concept of multi-junction OPVs comprising sub-cells with complementary spectra, and that are sufficiently thick to make use of the $2^{nd}$ and even the $3^{rd}$ optical interference maxima, show great potential for achieving exceptionally high performance OPVs. Thus, there is disclosed herein multi-junction small molecule organic photovoltaic (OPV) cells with efficiencies over 10%. In an embodiment, the device may comprise two or three vacuum thermally evaporated planar-mixed heterojunction sub-cells with minimal absorption overlap between the cells. By introducing a transparent interconnecting layer, a dual element (tandem) cell achieves a power conversion efficiency of 10.0±0.5%.

Also disclosed herein are multi-junction small molecule organic photovoltaic (OPV) cells that have an additional (3rd) sub-cell that absorbs at the second order optical interference maximum within the stack. The triple-junction cell significantly improves the quantum efficiency at shorter wavelengths, achieving a power conversion efficiency of 11.1±0.5%.

Accordingly, a subcell, as used herein, means a component of the device which comprises at least one donor-acceptor heterojunction. The donor-acceptor heterojunction may be chosen from those known in the art, such as a planar heterojunction, a bulk heterojunction, a mixed heterojunction, and a hybrid planar-mixed heterojunction. In certain embodiments, the first donor-acceptor heterojunction and the second donor-acceptor heterojunction are bulk heterojunctions. Alternatively, in certain embodiments, the first and second donor-acceptor heterojunctions are chosen from mixed heterojunctions and hybrid planar-mixed heterojunctions.

In one embodiment, the first donor-acceptor heterojunction has a thickness ranging from 40 to 100 nm, such as 50 to 90 nm or from 75 to 85 nm. The first donor-acceptor heterojunction may comprise DTDCTB and a fullerene, within these thickness ranges, such as DTDCTB:$C_{60}$ having a thickness ranging from 40 to 100 nm, such as 50 to 90 nm or from 75 to 85 nm.

When a subcell is used individually as a photosensitive optoelectronic device, it typically includes a complete set of electrodes. In a tandem photovoltaic device, such as those of the present disclosure and as shown in FIG. 1, each subcell may include an electrode, and the subcells may be divided by a separating layer. As known in the art for tandem devices, the separating layer may comprise at least one charge transfer layer, at least one electrode, or at least one charge recombination layer. In some tandem configurations, it is possible for the subcells to utilize a common, i.e., shared, electrode, charge transfer layer or charge recombination layer. In other cases, the subcells do not share common electrodes or charge transfer layers. The subcells may be electrically connected in parallel or in series.

In some embodiments, the charge transfer layer or charge recombination layer may be chosen from Al, Ag, Au, $MoO_3$, Li, LiF, Sn, Ti, WO3, indium tin oxide (ITO), tin oxide (TO), gallium indium tin oxide (GITO), zinc oxide (ZO), or zinc indium tin oxide (ZITO). In some embodiments, the charge transfer layer or charge recombination layer may comprise metal nanoclusters, nanoparticles, or nanorods. In some embodiments, the charge recombination layer comprises a thin metal layer. In certain embodiments, the charge recombination layer is less than or equal to 20 Å thick, such as, for example, less than or equal to 15 Å, less than or equal to 10 Å, or less than or equal to 5 Å thick. The small thickness can allow light to reach the back subcell.

One of the electrodes of the present disclosure may be an anode, and the other electrode a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a PV device, electrons move to the cathode from the photo-conducting material.

Similarly, the term "anode" is used herein such that in a PV device under illumination, holes move to the anode from the photoconducting material, which is equivalent to electrons moving in the opposite manner.

As described above, the first donor material in the first subcell comprises a donor-acceptor-acceptor (D-A-A) molecule, such as DTDCTB and derivatives thereof, which can be mixed with a fullerene. The first donor material (DTDCTB mixed with a fullerene) primarily absorb in the orange-to-NIR spectral region. The second donor material in the second subcell is chosen from DBP or DTDCPB, and derivatives thereof, which can be mixed with a fullerene. DBP and DTDCPB, when mixed with a fullerene, absorb primarily in the green spectral region. Thus, DTDCTB in the first subcell, and DBP (or DTDCPB) in the second subcell show considerable separation between their absorption maxima, thereby minimizing spectral overlap and maximizing photocurrent.

The first and second acceptor materials may be chosen from suitable materials known in the art. Examples of suitable acceptor materials include but are not limited to perylenes, naphthalenes, fullerenes, and fullerene derivatives (e.g., PCBMs, ICBA, ICMA, etc.). Non-limiting mention of fullerenes is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60]PCBM), Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}$CuPc), and derivatives thereof. Suitable acceptor materials may be chosen to be consistent with the desire of the present disclosure to minimize spectral overlap and maximize photocurrent.

In some embodiments, the first acceptor material and the second acceptor material each comprise a material independently chosen from fullerenes and derivatives thereof. In some embodiments, the fullerenes are chosen from $C_{60}$ and $C_{70}$. In certain embodiments, the first acceptor material comprises $C_{60}$. In certain embodiments, the second acceptor material comprises $C_{70}$. In certain embodiments, the second donor material comprises DBP and the second acceptor material comprises $C_{70}$. In certain embodiments, the second donor material comprises DTDCPB and the second acceptor material comprises $C_{70}$.

Like (DBP):$C_{70}$, the DTDCPB:$C_{70}$ mainly absorbs in green (300-800 nm) rather than NIR as does the DTDCTB:fullerene donor. As described, DTDCPB:$C_{70}$, has a longer absorption ranges (about a 100 nm longer) than DBP:$C_{70}$, and thus allows for varying with absorption spectra when used as the back cell in a multi-junction device in addition to, or instead of DBP:$C_{70}$.

In some embodiments of the present multi-junction devices, either the first subcell or the second subcell may act as the front subcell or the back subcell. The front subcell and the back subcell are used herein in the following manner: light enters the device through the front subcell and light that is not absorbed by the front subcell is passed to the back subcell. In certain embodiments, the front subcell may be provided with an electrode (anode or cathode as the case may be) that is substantially transparent in order to allow light to pass into the tandem cell. In some embodiments, the back subcell may be provided with a reflective electrode in order to allow incident light to be reflected back through the tandem device.

In some embodiments, the first subcell is the front subcell. In certain of these embodiments, the first acceptor material is $C_{60}$. In certain of these embodiments, the first acceptor material is $C_{60}$ and the second acceptor material is $C_{70}$. In some embodiments, the first subcell comprises an anode, and the second subcell comprises a cathode.

The subcells of the present disclosure may further comprise additional layers known in the art for photovoltaic devices. For example, the subcells may further comprise buffers layers, such as one or more charge collection/transporting layers and/or one or more blocking layers, such as exciton blocking layers (EBLs).

With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (Ru(acac)3), and aluminum(III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

In some embodiments, one or more blocking layers are located between an electrode and one of the photoactive regions. In some embodiments, one or more blocking layers are located between each of the photoactive regions and the corresponding electrodes.

In some embodiments, one or more charge collecting/transporting layers are located between an electrode and one of the photoactive regions. In some embodiments, one or more charge collecting/transporting layers are located between each of the photoactive regions and the corresponding electrodes. In some embodiments, one or more charge collecting/transporting layers are located between the separating layer and one or both of the photoactive regions. In certain embodiments, the charge collecting/transporting layers comprise a material chosen from metal oxides. In certain embodiments, the metal oxides are chosen from $MoO_3$, $V_2O_5$, ZnO, and $TiO_2$ In addition, the tandem devices may further comprise at least one smoothing layer.

As discussed above, the first and second subcells may be divided by a separating layer. The separating layer may comprise at least one charge transfer layer, at least one electrode, or at least one charge recombination layer.

In some embodiments, the separating layer further comprises an interconnecting layer. The interconnecting layer may comprise a mixture of a wide energy gap material and either an electron conducting material or a hole conducting material. The wide energy gap material will block excitons while the electron conducting material or hole conducting material will transport electrons or holes, respectively. For example, in an exemplary optimized tandem device according to the present disclosure, the separating layer comprises a thin Ag layer (0.1 nm) (i.e., the charge recombination layer) and an interconnecting layer. In one embodiment, the interconnecting layer comprises a mixture of BPhen and $C_{60}$. BPhen constitutes the wide energy gap material and blocks excitons, and $C_{60}$ is an electron conducting material and transports electrons to the charge recombination layer.

Suitable wide energy gap materials include, but are not limited to, bathocuproine (BCP), bathophenanthroline (BPhen), p-Bis(triphenylsilyl)benzene (UGH-2), (4,4'-N,N'-dicarbazole)biphenyl (CBP), N,N'-dicarbazolyl-3,5-benzene (mCP), poly(vinylcarbazole) (PVK), phenanthrene and alkyl and/or aryl substituted phenanthrenes, alkyl and/or aryl substituted derivatives of benzene, triphenylene and alkyl and/or aryl substituted triphenylenes, aza-substituted triphenylenes, oxidiazoles, triazoles, aryl-benzimidazoles, adamantane and alkyl and/or aryl substituted adamantanes, tetraarylmethane and its derivatives, 9,9-dialkyl-fluorene and its oligomers, 9,9-diaryl-fluorene and its oligomers, spiro-biphenyl and substituted derivatives, corannulene and its alkyl and/or aryl substituted derivatives, and derivatives thereof.

It is also advantageous for the interconnecting layer to be substantially transparent, or ideally entirely transparent, across the spectral region absorbed by the subcells, so as to permit as much relevant light as possible to pass from the front subcell to the back subcell. By mixing a transparent wide energy gap material with either an electron conducting material or a hole conducting material, the electron or hole conducting material may be sufficiently diluted, rendering the interconnecting layer transparent or substantially transparent at relevant wavelengths resulting in improved device performance. For example, the Inventors have discovered that the highly transparent exciton blocking and electron conducting bathophenanthroline (BPhen):$C_{60}$ interconnecting layer greatly improves the device Jsc and the overall tandem efficiency. For this reason, in one embodiment, it is employed in multi-junction structure connecting front and back sub-cells.

The wide energy gap material should have a HOMO-LUMO energy gap larger than the HOMO-LUMO gap of the nearest photoactive material. The electron conducting material should have a LUMO energy level equal to or lower than the LUMO energy level of the nearest photoactive material. In some embodiments, the electron conducting material comprises the same material as the nearest acceptor material. Thus, electron conducting materials may be chosen from the acceptor materials described herein and as known in the art. In a device configuration where a hole conducting material is appropriate, the hole conducting material should have a HOMO energy level higher than the HOMO energy level of the nearest photoactive material. In some embodiments, the hole conducting material comprises the same material as the nearest donor material.

Layers and materials may be deposited using techniques known in the art. For example, the layers and materials described herein can be deposited or co-deposited from a solution, vapor, or a combination of both. In some embodiments, organic materials or organic layers are deposited or co-deposited using vacuum evaporation, such as vacuum thermal evaporation, organic vapor phase deposition, or organic vapor-jet printing.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLE

Example 1

Multi-Junction OPV with a DTDCTB:$C_{60}$ Donor

In this example, a small molecule, all-vacuum-deposited multi-junction OPV was made by employing nanocrystalline planar-mixed heterojunctions. The front sub-cell consisted of the NIR-absorbing donor, 2-((7-(5-(dip-tolylamino) thiophen-2-yl)benzo[c][1,2,5]thiadiazol-4-yl) methylene) malononitrile (DTDCTB) mixed with $C_{60}$, paired with a green-absorbing dibenzo([f,f']-4,4',7,7-tetraphenyl)diindeno [1,2,3-cd:1',2',3'-lm] perylene (DBP):$C_{70}$ back sub-cell, which provided a spectrally complementary system that achieved a power conversion efficiency of $\eta_P$=10.0±0.5%.

The optimized structure of the two-junction tandem made according to this example was: ITO/$MoO_3$/DTDCTB:$C_{60}$ (1:1 ratio by vol.)/$C_{60}$/BPhen:$C_{60}$ (1:1)/Ag (1 Å)/$MoO_3$/ DBP:$C_{70}$ (1:10)/$C_{70}$/BPhen/Ag.

The ITO was initially cleaned in a series of detergents and treated with ultraviolet (UV)-ozone. The thin films were deposited using vacuum thermal evaporation in a chamber with a base pressure of $10^{-7}$ torr. The 100 nm thick Ag cathodes were deposited through a shadow mask containing an array of circular, 1 mm diameter openings. After cathode deposition, samples were transferred into a glove box filled with ultrapure (<0.1 ppm) $N_2$ for testing. The external quantum efficiency (EQE) was measured using monochromated light from a 200 Hz chopped Xe-lamp, and calibrated with a NIST-traceable Si detector. The current density-voltage (J-V) characteristics were measured with a filtered Xe lamp at various light intensities of AM 1.5G solar illumination. The intensity was measured using a NREL traceable Si reference cell. The $J_{SC}$ and $\eta_P$ were corrected for spectral mismatch.

Figure 1B:
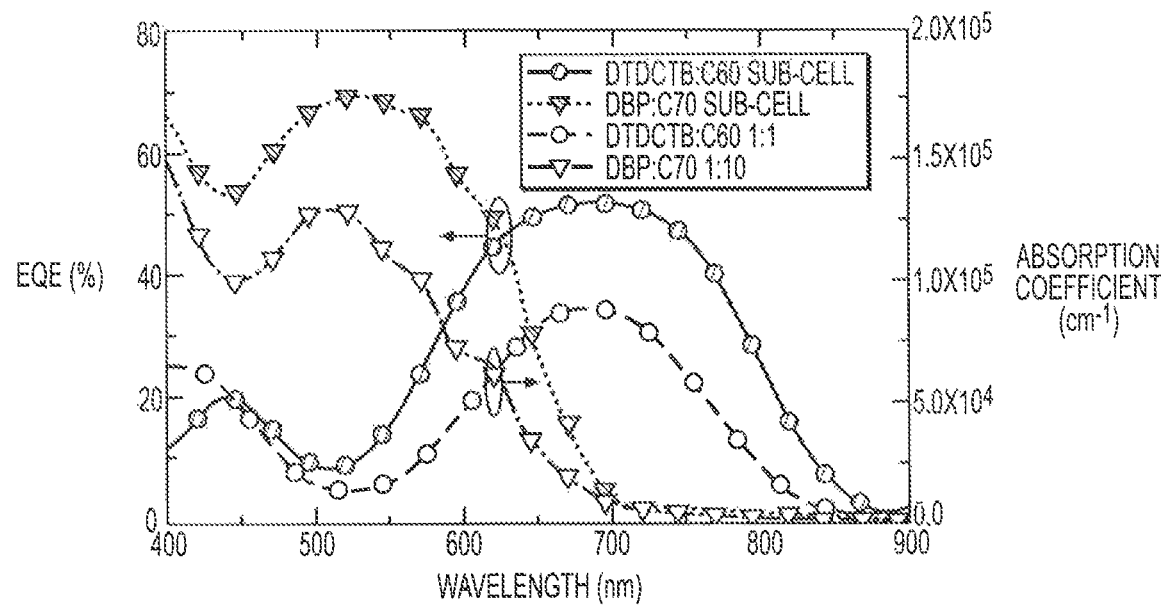

FIG. 1(a) shows the structure of the sub-cells used for their individual characterization and optimization prior to use in the stack. The "front-only" cell on the left comprised the NIR absorber DTDCTB mixed with $C_{60}$ in a 1:1 ratio, together with a neat $C_{60}$ layer to form a PM-HJ. A 0.1 nm thick Ag layer was deposited for charge recombination with the back cell. To estimate the optical field of the front cell in the tandem, a 40 nm thick $MoO_3$ spacer was deposited prior to the Ag cathode contact. The absorption coefficients of DTDCTB:$C_{60}$ (1:1) and DBP:$C_{70}$ (1:10) active layers, as well as the EQE of the sub-cells are shown in FIG. 1(b). The DTDCTB:$C_{60}$ film had a spectral response from λ=500 nm to 900 nm, while DBP:$C_{70}$ exhibited a broad absorption at λ<700 nm.

The fullerene, $C_{60}$, had absorption peaks at λ=360 nm and 450 nm, corresponding to Frenkel-type and intermolecular charge transfer (CT) exciton features, respectively. The CT absorption resulted from electrons excited from the highest occupied molecular orbital of one molecule to the lowest unoccupied molecular orbital of a nearby molecule, and it was the principal absorption feature of $C_{60}$ within the solar irradiation spectrum. In the front cell, $C_{60}$ was diluted in DTDCTB, therefore the CT feature was greatly suppressed due to a lack of adjacent molecules that could share excitations. Therefore, the DTDCTB:$C_{60}$ front cell only showed high EQE at longer wavelengths, with a maximum of 55% at $\lambda$=700 nm. On the other hand, the DBP:$C_{70}$ back cell exhibited an average EQE>60% at $\lambda$<600 nm. When combining these two cells into a tandem stack, absorption spanned the wavelengths from $\lambda$=400 nm to 900 nm, and hence the device harvested solar illumination efficiently with only minimal overlap in absorption by the sub-cells.

Note that the highly transparent exciton blocking and electron conducting bathophenanthroline (BPhen):$C_{60}$ interconnecting layer greatly improved the device Jsc and the overall tandem efficiency. For this reason, it was employed in this tandem structure connecting front and back sub-cells, replacing the slightly absorbing PTCBI interconnection layer conventionally used in previous small molecule tandem designs. Furthermore, the simulated optical field of the tandem cell indicated both sub-cells fit within the first interference maximum of the standing wave formed by incident illumination reflected from the cathode.

To take the advantage of optical field distribution and to reduce the absorption losses even further, a triple junction cell was made by inserting a second DBP:$C_{70}$ (1:10) cell in front of the DTDCTB:$C_{60}$ cell adjacent to the anode layer. This front DBP:$C_{70}$ cell thus fit into the second optical interference maximum for efficient absorption at shorter wavelengths. Such a design allowed for improvements by adding more sub-cells according to the optical field distribution at each interference maximum.

Figure 2:
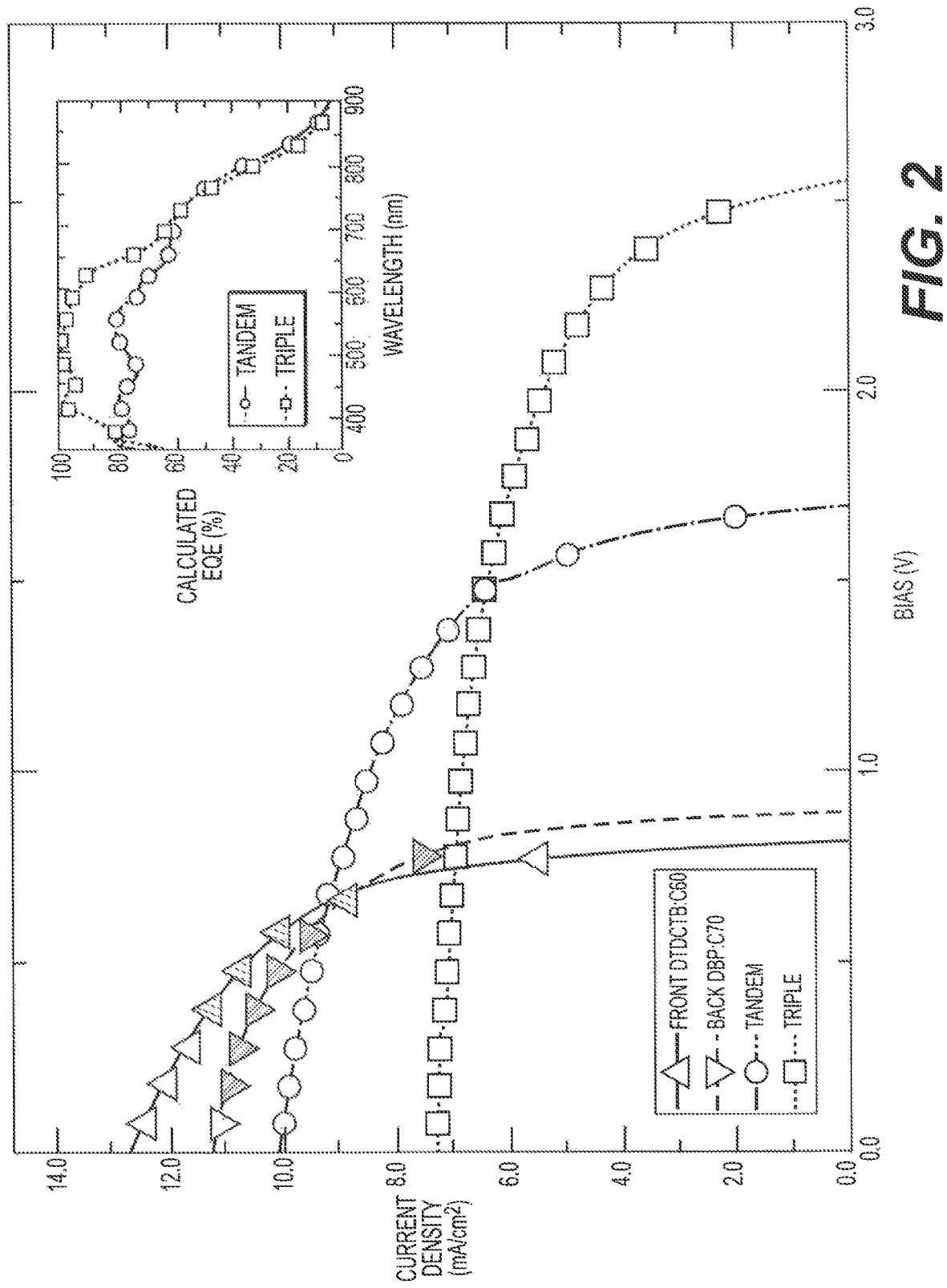
FIG. 2 Fourth quadrant measured current density-voltage characteristics of tandem, triple-junction and the tandem sub-cells. Inset: Calculated quantum efficiency (QE) of the tandem and the triple-junction cells.

The measured fourth quadrant current density-voltage (J-V) characteristics of the discrete, tandem and the triple-junction cells is shown in FIG. 2, with their performance parameters summarized in Table 1. All the measurements were made under 1 sun AM 1.5G illumination, with $J_{SC}$ and $\eta_P$ corrected for spectral mismatch (factor M). Both discrete, tandem sub-cells exhibit similar $\eta_P$~6.1%. The tandem cell thereby achieved $J_{SC}$=10.2±0.5 mA/cm$^2$ (M=0.95±0.01), $V_{OC}$=1.73±0.01 V, FF=0.57±0.01 and $\eta_P$=10.0±0.5%, which was more than 60% higher than its component sub-cells. For the triple-junction cell, $V_{OC}$ increased to 2.58±0.02 V. Although $J_{SC}$ was reduced to 7.3±0.4 mA/cm$^2$, the overall efficiency reached 11.1±0.5%. The calculated quantum efficiency (QE) of triple-junction cell which contained two DBP:$C_{70}$ sub-cells was significantly higher than the tandem at $\lambda$<700 nm, reaching almost 100% from $\lambda$=400 nm to 600 nm (FIG. 2. inset).

TABLE I

Summary of Cell Performances

| Cells* | $J_{SC}$ (mA/cm$^2$) | $V_{OC}$ (V) | FF | $\eta_P$ (%) | M |
|---|---|---|---|---|---|
| Front | 12.8 ± 0.6 | 0.83 ± 0.01 | 0.57 ± 0.01 | 6.1 ± 0.3 | 0.92 |
| Back | 11.3 ± 0.6 | 0.90 ± 0.01 | 0.60 ± 0.01 | 6.1 ± 0.3 | 1.01 |
| Tandem | 10.2 ± 0.5 | 1.73 ± 0.01 | 0.57 ± 0.01 | 10.0 ± 0.5 | 0.95 |
| Triple | 7.3 ± 0.4 | 2.58 ± 0.02 | 0.59 ± 0.01 | 11.1 ± 0.5 | 0.97 |

With reference to Table 1, 'Front' and 'Back' are the discrete sub-cells in the tandem device, respectively referring to the planar-mixed heterojunction (PM-HJ) DTDCTB:$C_{60}$ cell near the anode and the PM-HJ DBP:$C_{70}$ cell near the cathode; 'Tandem' employs a BPhen:$C_{60}$ buffer layer interconnecting the sub-cells. 'Triple' adds a second DBP:$C_{70}$ sub-cell near the anode. All measured $J_{SC}$ and $\eta_P$ are spectrally corrected.

Example 2

Four-Junction OPV with a DTDCTB:$C_{60}$ Donor

Figure 3B:
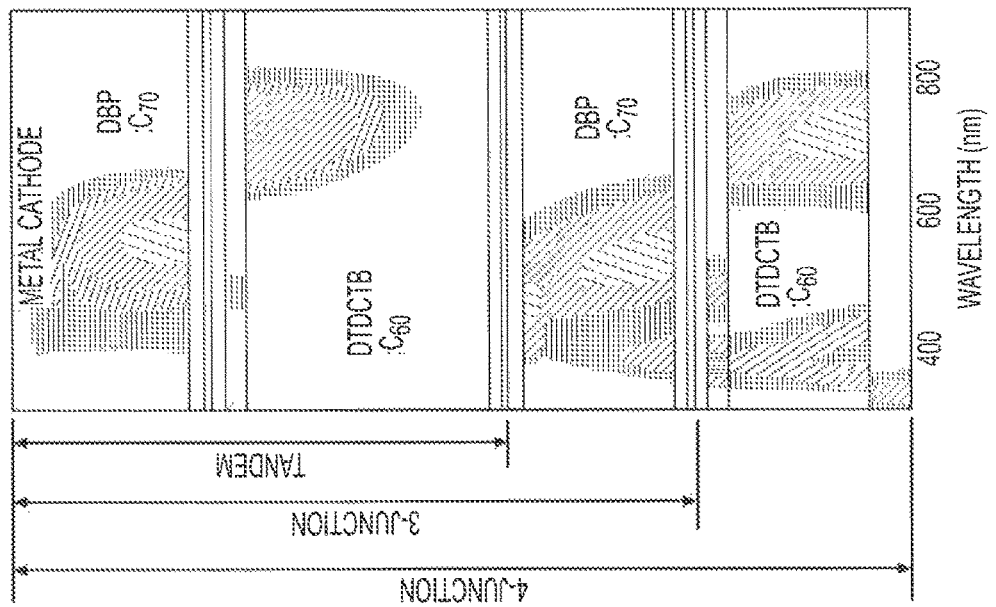
FIG. 3(b) shows absorption characteristics of the tandem, three junction, and four junction cells of FIG. 3(a).
Figure 3A:
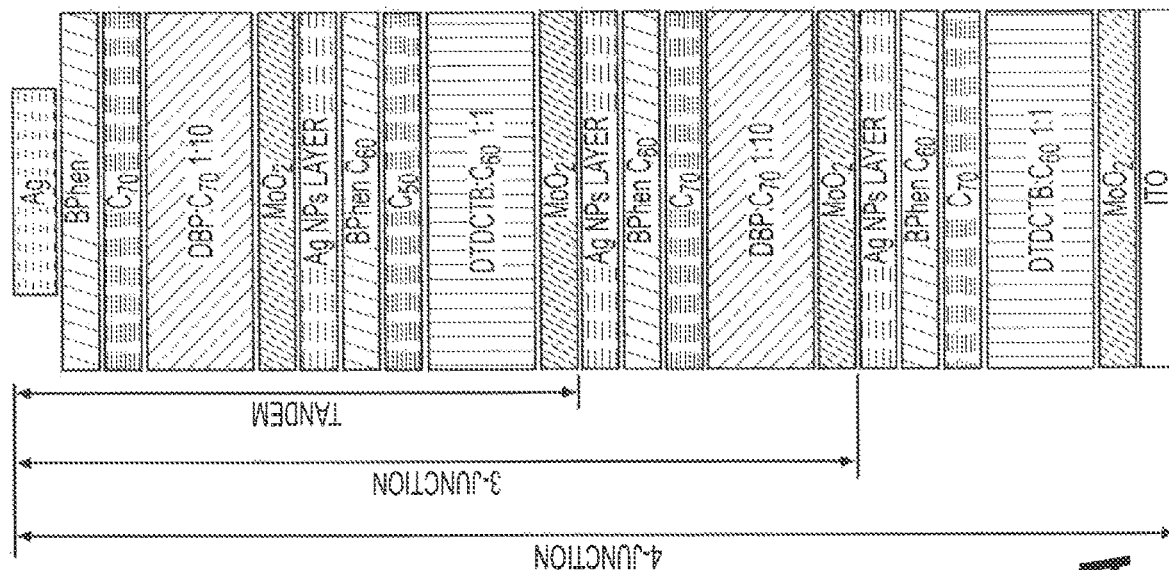
FIG. 3(a) Is a schematic of multijunction cells showing tandem, three junction, and four junction cells according to embodiments disclosed herein.

In this example, a small molecule, all-vacuum-deposited four-junction OPV was made in accordance with the procedures described in Example. 1. Like Example 1, the optimized structure of this four junction device comprises a combination of the following two-junction tandems: ITO/MoO$_3$/DTDCTB:$C_{60}$ (1:1 ratio by vol.)/$C_{60}$/BPhen:$C_{60}$ (1:1)/Ag (1 Å)/MoO$_3$/DBP:$C_{70}$ (1:10)/$C_{70}$/BPhen/Ag. The complete structure is shown in FIG. 3. In particular, FIG. 3(a) Is a schematic of multijunction cells showing tandem, three junction, and four junction cells according to embodiments disclosed herein. FIG. 3(b) shows absorption characteristics of the tandem, three junction, and four junction cells of FIG. 3(a).

As in the tandem device of FIG. 1, and Example 1, the highly transparent exciton blocking and electron conducting bathophenanthroline (BPhen):$C_{60}$ is used as an interconnecting layer between subcells. This improved the device Jsc and the overall tandem efficiency.

Figure 4:
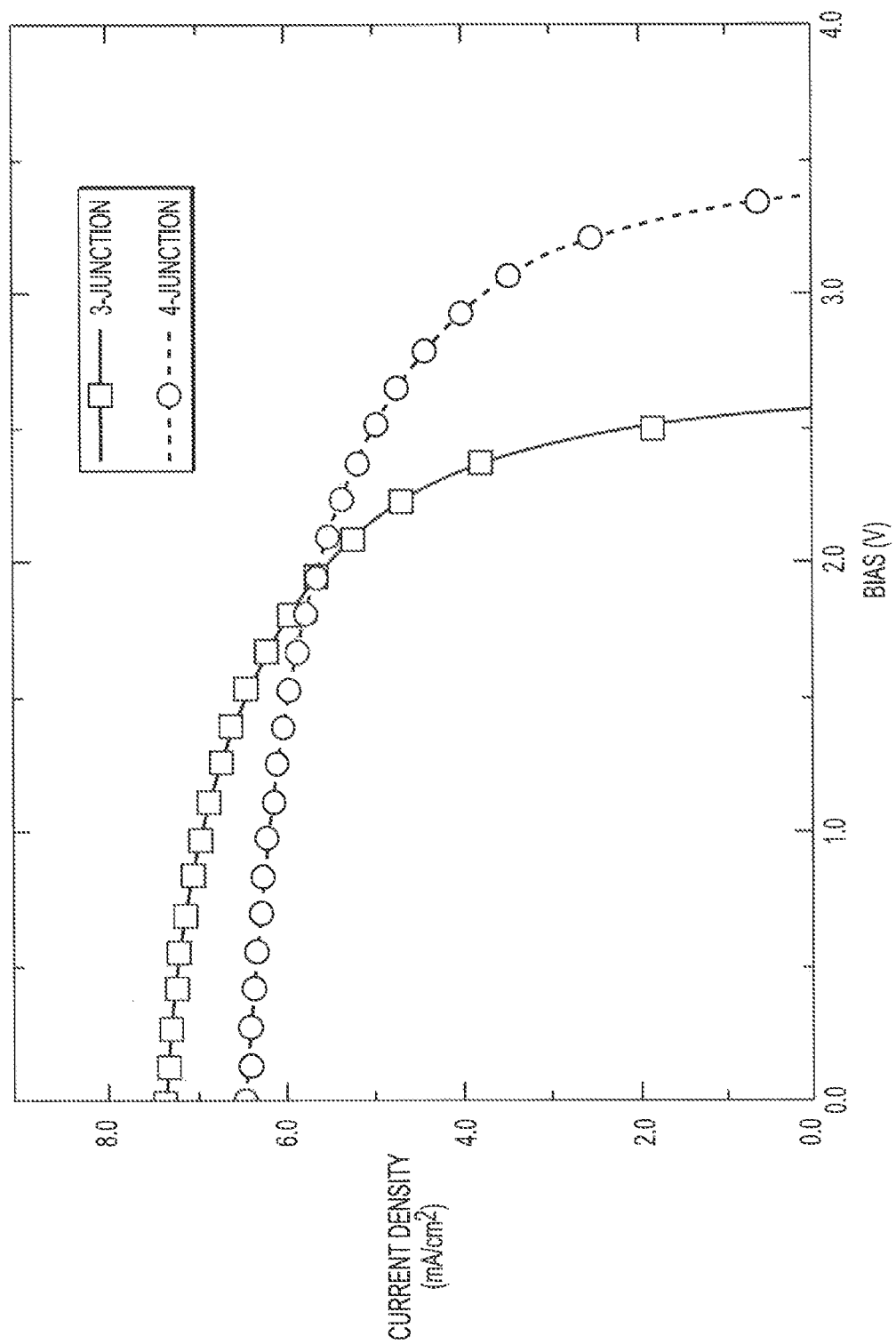
FIG. 4 Fourth quadrant measured current density-voltage characteristics comparing triple-junction and four junction sub-cells.

The measured fourth quadrant current density-voltage (J-V) characteristics of the triple and four junction subcells are shown in FIG. 4, with their performance parameters summarized in Table 2.

TABLE 2

Summary of Cell Performances

| Cell | $J_{SC}$ (mA/cm$^2$) | $V_{OC}$ (V) | FF | PCE (%) |
|---|---|---|---|---|
| 3-junction | 7.3 | 2.58 | 0.59 | 11.1 |
| 4-junction | 6.4 | 3.38 | 0.58 | 12.6 |

All the measurements shown in Table 1 were made under 1 sun AM 1.5G illumination, with $J_{SC}$ and $\eta_P$ corrected for spectral mismatch (factor M). Both discrete, tandem sub-cells exhibit similar $\eta_P$~6.1%. The triple junction cell cell thereby achieved $J_{SC}$=7.1±0.5 mA/cm$^2$ (M=0.97±0.01), $V_{OC}$=2.58±0.01 V, FF=0.59±0.01 and $\eta_P$=10.8±0.5%. For the four-junction cell, $V_{OC}$ increased to 3.38±0.02 V with a FF=0.58±0.01. Although $J_{SC}$ was reduced to 6.4±0.4 mA/cm$^2$ (M=0.95±0.01), the overall efficiency reached 12.6±0.5%. The calculated quantum efficiency (QE) of four-junction cell which contained two DTDCTB:C60 sub-cells and two DBP:$C_{70}$ sub-cells was significantly higher than the triple-junction cell.

What is claimed is:

1. A multi-junction photovoltaic device comprising:
   a first subcell comprising a first photoactive region;
   a second subcell comprising a second photoactive region; and
   a separating layer between the first and second subcell, wherein the separating layer comprises a charge recombination layer and an at least substantially transparent interconnecting layer, wherein,
   the at least substantially transparent interconnecting layer comprises bathophenantholine (BPhen):$C_{60}$;
   the first photoactive region comprises:
   a first donor material comprising a donor-acceptor-acceptor molecule having an NIR absorption spectra, and a first acceptor material comprising a fullerene, wherein the first donor material and the first acceptor material forms a first donor-acceptor heterojunction; and the second photoactive region comprises:
a second donor material having an absorption spectra that is complementary with the absorption spectra of the first donor material, and a second acceptor material comprising a fullerene, wherein the second donor material and the second acceptor material forms a second donor-acceptor heterojunction,
wherein the device exhibits an absorption in wavelengths ranging from $\lambda=400$ nm to 900 nm,
wherein the device achieves a power conversion efficiency of at least $\eta p=10.0\pm0.5\%$, and
wherein the device has a tandem junction.

2. The multi-junction photovoltaic device of claim 1, wherein the donor-acceptor-acceptor molecule comprises DTDCTB.

3. The multi-junction photovoltaic device of claim 2, wherein the DTDCTB is mixed with fullerene in a 1:1 ratio.

4. The multi-junction photovoltaic device of claim 3, wherein the fullerene mixed with DTDCTB is chosen from $C_{60}$ and $C_{70}$.

5. The multi-junction photovoltaic device of claim 1, wherein the fullerene for the first acceptor material and the second acceptor material are chosen from $C_{60}$ and $C_{70}$.

6. The multi-junction photovoltaic device of claim 1, wherein the second donor material has an absorption spectra of less than $\lambda=700$ nm.

7. The multi-junction photovoltaic device of claim 1, wherein the second donor material comprises DBP or DTDCTB mixed with a fullerene.

8. The multi-junction photovoltaic device of claim 7, wherein DBP is mixed with a fullerene in a DBP:fullerene ratio of 1:10.

9. The multi-junction photovoltaic device of claim 7, wherein the fullerene is chosen from $C_{60}$ and $C_{70}$.

10. The multi-junction photovoltaic device of claim 1, wherein the charge recombination layer comprises a material chosen from Al, Ag, Li, LiF, Sn, and Ti.

11. The multi-junction photovoltaic device of claim 1, wherein the at least substantially transparent interconnecting layer comprises a mixture of a wide energy gap material and one of an electron conducting material and a hole conducting material.

12. The multi-junction photovoltaic device of claim 1, further comprising a charge collecting layer between the separating layer and one of the first and second photoactive regions, wherein the charge collecting layer comprises a metal oxide.

13. The multi-junction photovoltaic device of claim 12, wherein the metal oxide is chosen from $MoO_3$, $V_2O_5$, ZnO, and $TiO_2$.

14. The multi-junction photovoltaic device of claim 1, further comprising a triple junction, said triple junction comprising an additional or second cell comprising DBP:$C_{70}$ or DTDCTB:$C_{70}$ in front of the DTDCTB:$C_{60}$ cell.

15. The multi-junction photovoltaic device of claim 14, which achieves a power conversion efficiency of at least $\eta p=11.0\%$.

16. The multi-junction photovoltaic device of claim 1, wherein said device is a four junction device comprising two tandem sub-cells stacked together with interconnecting layer comprising BPhen:$C_{60}$ between said tandem sub-cells.

17. The multi-junction photovoltaic device of claim 16, wherein said four junction device achieves a power conversion efficiency of at least $\eta p=12.0\%$.

18. The multi-junction photovoltaic device of claim 1, wherein the first donor-acceptor heterojunction has a thickness ranging from 40 to 100 nm.

19. The multi-junction photovoltaic device of claim 18, wherein the donor-acceptor heterojunction has a thickness ranging from 75 to 85 nm, and comprises DTDCTB:$C_{60}$.

20. The multi-junction photovoltaic device of claim 1, wherein the first subcell is on the anode side of the device and the second subcell is on the cathode side of the device.

* * * * *